United States Patent [19]

Tarricone et al.

[11] Patent Number: 5,399,911

[45] Date of Patent: Mar. 21, 1995

[54] PULSE DETECTION CIRCUIT

[75] Inventors: Mark P. Tarricone, Beverly; John M. Gambale; Roger A. Martin, both of Swampscott, all of Mass.

[73] Assignee: General Electric Company, Cincinnati, Ohio

[21] Appl. No.: 194,954

[22] Filed: Feb. 14, 1994

[51] Int. Cl.[6] .............................................. H03K 5/22
[52] U.S. Cl. ....................................... 327/72; 327/77; 327/50; 327/18
[58] Field of Search ................ 307/234, 290, 354, 356, 307/471, 494, 515, 518, 519; 328/112, 113, 116, 117, 120, 147, 149

[56] References Cited

U.S. PATENT DOCUMENTS

| | | | |
|---|---|---|---|
| 3,755,745 | 8/1973 | Sapir | 328/133 |
| 3,969,677 | 7/1976 | Woyton | 328/140 |
| 3,984,701 | 10/1976 | Pieper | 307/515 |
| 4,024,458 | 5/1977 | Templin | 328/133 |
| 4,267,470 | 5/1981 | Kawakami et al. | 307/515 |
| 4,845,379 | 7/1989 | Carlsten | 328/120 |

Primary Examiner—Timothy P. Callahan
Assistant Examiner—Jeffrey S. Zweizig
Attorney, Agent, or Firm—Jerome C. Squillaro; Bernard E. Shay

[57] ABSTRACT

A pulse detection circuit detects one different pulse within a string of similar pulses for a once per revolution index. The pulse detection circuit comprises a DC averaging means for generating a first threshold voltage from a raw signal. An average comparator receives the first threshold voltage and generates a first output voltage indicative of signal amplitude of the raw signal, as compared to the first threshold voltage. A zero comparator receives the raw signal, compares it to zero, and generates a second output voltage indicative of a pulse. The first and second output voltages are input to a logic sequence to generate a logic output when the one different pulse within the string of similar pulses is detected.

10 Claims, 2 Drawing Sheets

PULSE DETECTION CIRCUIT

BACKGROUND OF THE INVENTION

The present invention relates to aircraft engines and, more particularly, to a pulse detection circuit for use with any gas turbine jet engine utilizing an AC signal with a one-per-revolution index for indication. Specifically, this invention is applicable to aid in balancing the fan module of a gas turbine engine.

The General Electric CF34-3A1 regional jet engine uses a bearing lock nut with twenty-eight teeth to generate a magnetic field and is detected using a magnetic pick-up speed sensor. The sensor signal is proportional to fan speed and outputs twenty-eight pulses for every fan rotor revolution. One of the twenty-eight pulses is a lower amplitude because of a shaved tooth on the bearing lock nut that causes a larger gap between the tooth and the speed sensor.

An output signal indicative of the low pulse for the once-per-revolution is needed to balance the engine fan module. Unfortunately, there is a lack of test instrumentation capable of discriminating all of the high pulses and outputting only the low pulse for once-per-revolution indication. This lack of available instrumentation results in a lengthy procedure to balance the fan. This includes mounting temporary instrumentation to generate a one-per-revolution signal. Presently, special tape and an optical sensor are added to the engine fan during manufacturing. The system has to be taken off the engine when the procedure is complete. This takes over twelve man hours and consumes even more time when an engine is installed in an aircraft because the fan is not easily accessible.

Limitations of other equipment used to detect pulses is that they can not work over a wide range of amplitude and frequency without adjustment. This is because the amplitude of a speed sensor signal varies with frequency, speed sensor gain, and the gap between the sensor and the material generating the magnetic field, i.e., the bearing lock nut. This makes it difficult to have a fixed threshold to detect an index with a varying amplitude and frequency.

It is therefore highly desirable and an object of the present invention to provide a system for detecting an index signal without removing the engine or adding temporary instrumentation.

Another object of the present invention is to provide a system which allows for detection of the index signal that is part of the fan speed signal.

Another object of the present invention is to provide such a system for use with speed sensor generated signals.

These objects and other features and advantages will become more readily apparent in the following description when taken in conjunction with the appended drawings.

SUMMARY OF THE INVENTION

The present invention has been developed to fulfill the needs noted above. The present invention is a low-/high pulse detection circuit designed to work on an AC signal that has an index signal for one per revolution indication. The present invention allows for detection of the index signal that is part of the fan speed signal. In order to balance a rotating fan and shaft, it is necessary to know how much excess weight there is and the location of the excess weight. A low pulse detector allows the user to trigger on an index, thus determining the location of the imbalance. Unlike other instrumentation available, the circuit of the present invention will allow detection of a relatively low or high pulse over a wide range of amplitudes and frequencies without need for adjustment, permitting testing over the entire engine operating range. This makes the present invention ideal for use with speed sensor generated signals. A typical application of the present invention is a speed signal with one pulse peak, or index, for example a pulse that is slightly lower than the other pulses in the total cycle, where a total cycle is one turn of the fan rotor.

Briefly, in accordance with the present invention, a pulse detection circuit detects one different pulse within a string of similar pulses for a once per revolution index. The pulse detection circuit comprises a DC averaging means for generating a first threshold voltage from a raw signal. An average comparator receives the first threshold voltage and generates a first output voltage indicative of signal amplitude of the raw signal, as compared to the first threshold voltage. A zero comparator receives the raw signal, compares it to zero, and generates a second output voltage indicative of a pulse. The first and second output voltages are input to a logic sequence to generate a logic output when the one different pulse within the string of similar pulses is detected. The detection circuit further comprises a self adjusting averaging threshold that follows an input circuit.

By instrumenting the fan module with readily available equipment to measure balance, it can be readily determined if an assembly is out of balance. To fix or re-balance the assembly, the location of the access material must be known. The toothed gear of the speed circuit of the engine has one small tooth that stays in the same relation to the fan. By triggering on that particular tooth, the location of the imbalance can be determined. The low pulse detector of the present invention extracts the small tooth without the need for any additional engine hardware.

As will be obvious to those skilled in the art, the technique of the present invention can be similarly applied to one high pulse in a string of low pulses.

In the drawings as hereinafter described, a preferred embodiment is depicted; however, various other modifications and alternative constructions can be made thereto without departing from the true spirit and scope of the invention. For example, the process can be applied to a variety of engine and aircraft applications, including fan modules for aircraft, tank engines, and other mobile vehicles.

DETAILED DESCRIPTION OF THE PREFERRED EMBODIMENTS

Figure 1:
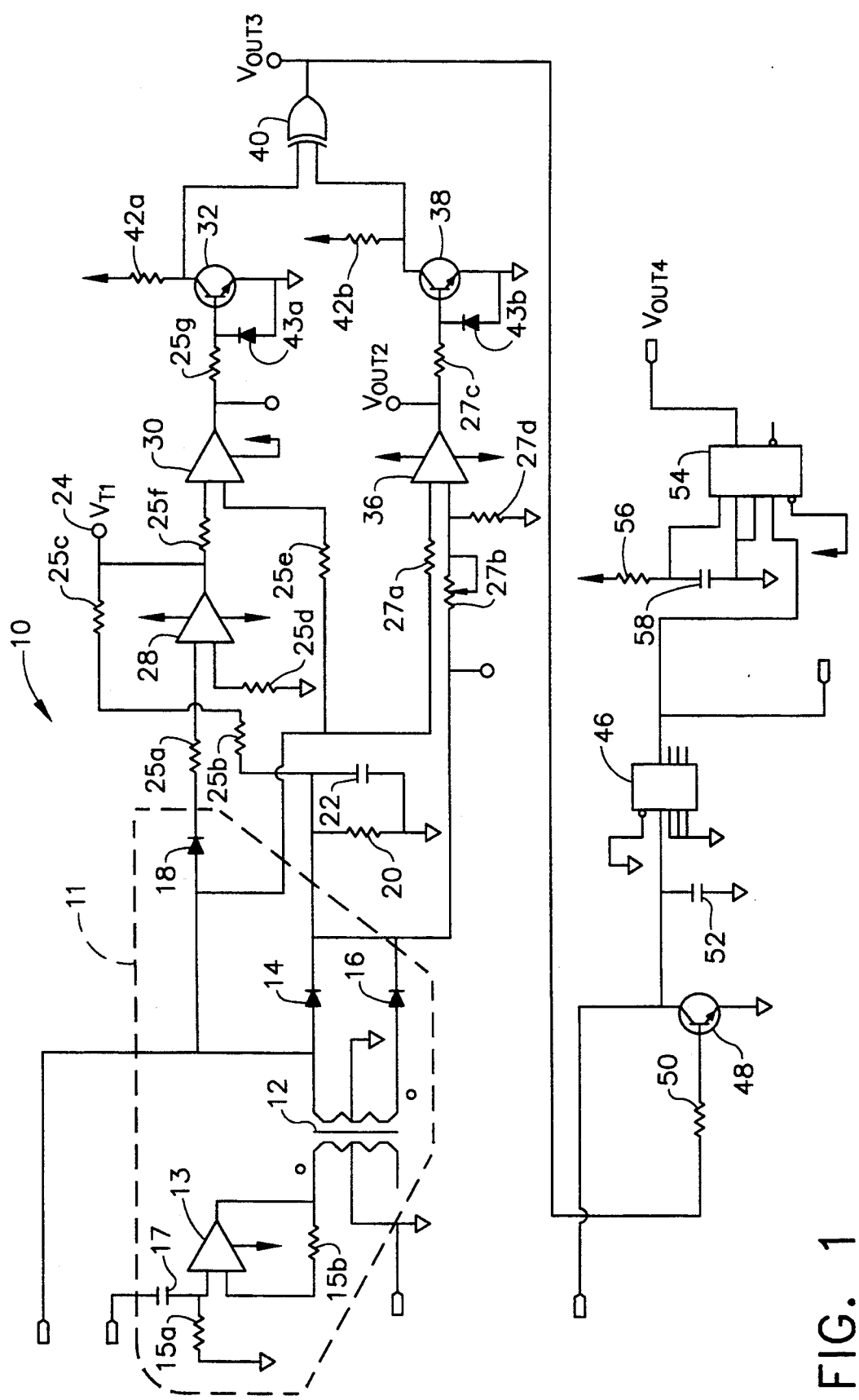
FIG. 1 is a schematic diagram of the low/high pulse detection circuit according to the present invention.
Figure 2:
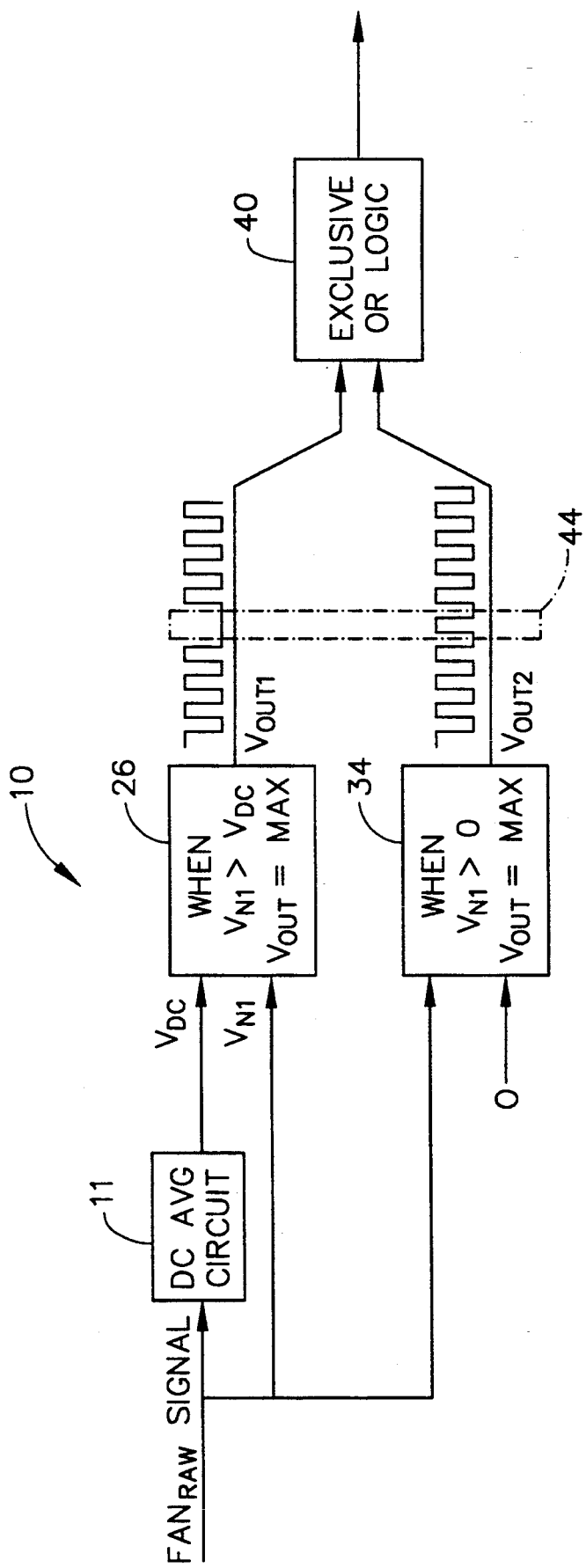
FIG. 2 is a schematic block diagram of a short tooth detection application of the low/high pulse detection circuit of FIG. 1.

Referring now to the drawings, in FIGS. 1 and 2 there is illustrated a schematic diagram showing a low-/high pulse detection circuit 10 for use with any gas turbine jet engine utilizing an AC signal with a one-per-revolution index for indication of the speed or RPM's of a jet engine. The one-per-revolution signal is the final signal of the circuit.

In FIGS. 1 and 2, a raw fan speed signal $FAN_{RAW}$ is applied to a DC average circuit 11, where the signal is transformer isolated and full wave rectified by transformer 12 and diodes 14 and 16. The DC average block further comprises an amplifier 13, associated electronics including resistors 15a and 15b, capacitor 17, and diode 18. The resulting rectified signal is applied to a resistor 20 and is converted to a DC average voltage $V_{DCAVG}$ by capacitor 22. The sum of the DC average voltage and a half wave rectified signal from transformer 12 and diodes 14 and 16 is a threshold voltage, $V_{T1}$, at output 24. Associated electronics include resistors 25a, 25b, 25c, 25d, 25e, 25f and 25g. The threshold voltage is applied to an average comparator 26, comprised of amplifiers 28 and 30, and transistor 32. The average comparator 26 compares the raw signal $FAN_{RAW}$ to the average DC of the same signal. Hence, the raw fan speed signal $FAN_{RAW}$ provides the input to the comparator 26. When the signal amplitude of the raw fan speed signal $FAN_{RAW}$ is greater than the threshold voltage $V_{T1}$, an output voltage $V_{OUT1}$ output from the comparator 26 will go high for the time that the raw fan signal is above the threshold voltage. This will strip out the low pulse because the small tooth signal will not be large enough to cross the threshold voltage.

The raw fan speed signal $FAN_{RAW}$ is also input into a zero comparator 34, comprised of amplifier 36 and transistor 38, with associated electronics including resistors 27a, 27b, 27c, and 27d. The zero comparator 34 has a low, second threshold voltage $V_{T2}$, closer to zero than the threshold voltage $V_{T1}$. The zero comparator 34 compares the raw signal $FAN_{RAW}$ against zero. Comparator 34 triggers on every pulse so output voltage $V_{OUT2}$ from the comparator 34 is a square wave at the same frequency as the input speed signal, which is the same frequency as the raw fan speed signal. Therefore, at the point in time where the average comparator 26 is putting out a pulse train with a missing pulse, and the zero comparator 34 is putting out a pulse, output voltages $V_{OUT1}$ and $V_{OUT2}$ are input into an exclusive OR logic sequence to produce an output in only this situation. The exclusive OR logic sequence, shown as OR gate 40. Associated electronics includes resistors 42a and 42b; and diodes 43a and 43b. Therefore, an output is provided at the precise instant in time when the small tooth is observed. The output voltage $V_{OUT3}$ of the logic is shown in Table 1 below. Thus, $V_{OUT3}$ is only high when $V_{OUT1}$ and $V_{OUT2}$ are in opposite states.

TABLE 1

| $V_{OUT1}$ | $V_{OUT2}$ | $V_{OUT3}$ |
|---|---|---|
| LOW | LOW | LOW |
| LOW | HIGH | HIGH |
| HIGH | LOW | HIGH |
| HIGH | HIGH | LOW |

Theoretically, the logic shown in Table 1 will only occur when the short tooth pulse is inputted into comparators 26 and 34. The third situation listed in Table 1, HIGH, LOW, HIGH will never occur. Therefore, the output of the exclusive OR logic will only output a HIGH signal when the small tooth is detected. For example, when comparator 26 does not trigger and its output stays low, comparator 34 will detect the short pulse and its output will go high, as indicated by the dotted line of block 44. Output voltage $V_{OUT3}$ will go high at this time and the once per revolution signal is detected.

Since comparator 26 has a higher trigger voltage, $V_{T1}$, than the trigger voltage, $V_{T2}$, of comparator 34, the output pulses from each comparator have different pulse widths, which are determined by the time above the respective threshold voltages. Exclusive OR logic 40 is activated for the short time difference in pulse widths. However, these secondary pulses are much shorter than the pulse width generated from the short tooth. Therefore, a filter, comprised of transistor 48, resistor 50, and capacitor 52, can be used to separate the short tooth pulse from the other secondary pulses.

Continuing with FIGS. 1 and 2, the circuit 10 further includes a buffer 46, and a Schmitt trigger 54 which is used to generate the final output pulse. The input to the Schmitt trigger must be above 2.5 volts before the output will go high. The filter time constant is set so that the time to charge capacitor 52 above 2.5 volts is greater than the time span of the secondary pulses. Only the short tooth generated pulse is long enough in duration to charge capacitor 52 to activate the output of the Schmitt trigger, indicated as output voltage $V_{OUT4}$. Resistor 56 and capacitor 58 establish the on time of the Schmitt trigger 54.

As illustrated in FIG. 1, a self adjusting averaging threshold (SAAT), comprised of the DC averaging circuit 11, follows the input circuit. The SAAT is incorporated onto the low/high pulse detection circuit 10 of the present invention to generate the DC average signal. The SAAT threshold varies over the entire range of speed signal amplitudes and frequencies. This allows the circuit 10 to work with many varying parameters. These parameters include an AC speed sensor signal amplitude, a frequency of the AC signal, and an air or other medium gap between the speed sensor and the material that generates the magnetic field. Without the SAAT circuit 11, the low/high pulse could not be differentiated from the secondary pulses. This circuit has been tested to detect a 12% drop in output voltage in a series of pulses, which is equivalent to 0.3 volts peak difference (i.e., 2.4 Vpeak versus 2.1 Vpeak) using a saw tooth waveshape. A smaller difference could be detected with a sinusoidal signal because the pulses generated from this type of signal are wider and easier to differentiate.

As will be obvious to those skilled in the art, many variations and modifications could be implemented without departing from the scope of the invention. For example, alternatives to low pulse triggering or detection would be a high pulse detection circuit, wherein the same self adjusting averaging threshold detection circuit would detect the high pulse from a string of low pulses. This would also work over the varying parameters as discussed above.

It is seen from the foregoing, that the objectives of the present invention are effectively attained, and, since certain changes may be made in the construction set forth, it is intended that matters of detail be taken as illustrative and not in a limiting sense.

What is claimed is:

1. A pulse detection circuit for detecting one different pulse within a string of similar pulses for a once per revolution index, the pulse detection circuit comprising:

a DC averaging means for generating a first threshold voltage from a raw signal;

an average comparator for receiving the first threshold voltage and generating a first output voltage indicative of signal amplitude of the raw signal, as compared to the first threshold voltage;

a zero comparator for receiving the raw signal, comparing the raw signal to zero, and generating a second output voltage indicative of a pulse;

a logic sequence for receiving as inputs the first and second output voltages to generate a logic output when the one different pulse within a string of similar pulses is detected.

2. A pulse detection circuit as claimed in claim 1 further comprising a Schmitt trigger.

3. A pulse detection circuit as claimed in claim 2 further comprising an input filter for filtering the logic output and applying the filtered logic output to a buffer and the Schmitt trigger to generate a final output.

4. A pulse detection circuit as claimed in claim 1 wherein the one different pulse has a lower amplitude than the string of similar pulses.

5. A pulse detection circuit as claimed in claim 4 wherein the lower amplitude of the one different pulse is not large enough to exceed the first threshold voltage.

6. A pulse detection circuit as claimed in claim 5 wherein the zero comparator triggers on every pulse.

7. A pulse detection circuit as claimed in claim 6 wherein the logic sequence generates a logic HIGH output at an instant when the zero comparator triggers to indicate a pulse and the average comparator indicates an amplitude less than the first threshold voltage.

8. A pulse detection circuit for detecting a low pulse within a string of higher pulses in a once per revolution index for balancing a gas turbine engine fan module having a toothed gear with one small tooth that stays in the same relation to the fan, the pulse detection circuit comprising:

a DC averaging means for generating a first threshold voltage from a raw fan speed signal;

an average comparator for receiving the first threshold voltage and generating a logic HIGH signal for each generated pulse which exceeds the first threshold voltage;

a zero comparator for receiving the raw fan speed signal, comparing the raw fan speed signal to zero, and triggering for every detected pulse;

a logic sequence for generating a logic HIGH output at an instant when the zero comparator triggers to indicate a pulse and the average comparator indicates an amplitude less than the first threshold voltage.

9. A pulse detection circuit as claimed in claim 8 further comprising a Schmitt trigger.

10. A pulse detection circuit as claimed in claim 9 further comprising an input filter for filtering the logic HIGH output and applying the filtered logic output to a buffer and the Schmitt trigger to generate a final output.

* * * * *